United States Patent [19]

Edgley et al.

[11] Patent Number: 5,279,415
[45] Date of Patent: Jan. 18, 1994

[54] PACKAGING SYSTEM INCORPORATING STORAGE TUBES FOR ELECTRICAL CONNECTORS

[75] Inventors: Richard R. Edgley, Elmhurst; Robert E. Erklin, Sr., Bedford Park; William R. Lenz, Lockport; Kyle J. Marchek, Lisle, all of Ill.

[73] Assignee: Molex Incorporated, Lisle, Ill.

[21] Appl. No.: 43,328

[22] Filed: Apr. 6, 1993

[51] Int. Cl.⁵ .................... B65D 73/02; B65D 85/42
[52] U.S. Cl. ................................. 206/328; 206/334
[58] Field of Search ................... 206/328, 330, 334

[56] References Cited

U.S. PATENT DOCUMENTS

| | | | |
|---|---|---|---|
| 4,485,531 | 12/1984 | Murphy | 206/328 X |
| 4,598,820 | 7/1986 | Murphy | 206/328 |
| 4,702,371 | 10/1987 | Hoshi et al. | 206/328 |
| 4,763,780 | 8/1988 | Zebley et al. | 206/330 |
| 4,764,079 | 8/1988 | Linker, Sr. et al. | 414/411 |
| 4,836,371 | 6/1989 | Long et al. | 206/328 X |
| 4,878,801 | 11/1989 | Pearson | 414/411 |
| 4,903,380 | 2/1990 | Kirby | 206/334 X |

FOREIGN PATENT DOCUMENTS 2112753 7/1983 United Kingdom ............... 206/328

Primary Examiner—William I. Price
Attorney, Agent, or Firm—Stephen Z. Weiss

[57] ABSTRACT

A packaging system is disclosed for storing and handling electrical connectors and the like. The system employs a plurality of elongated connector-containing tubes. Each tube has an aperture therethrough near each opposite end thereof. The apertures are spaced longitudinally of the respective tubes so that a pair of assembly rods can be passed through the aligned apertures of a plurality of generally parallel juxtaposed tubes. The assembly rods hold the tubes in a generally stacked array and also act as stop rods to close-off the ends of the tubes. At least one aperture in each tube is enlarged relative to the rod passing therethrough for accommodating any variances in the spacing between the apertures in any particular tubes.

2 Claims, 2 Drawing Sheets

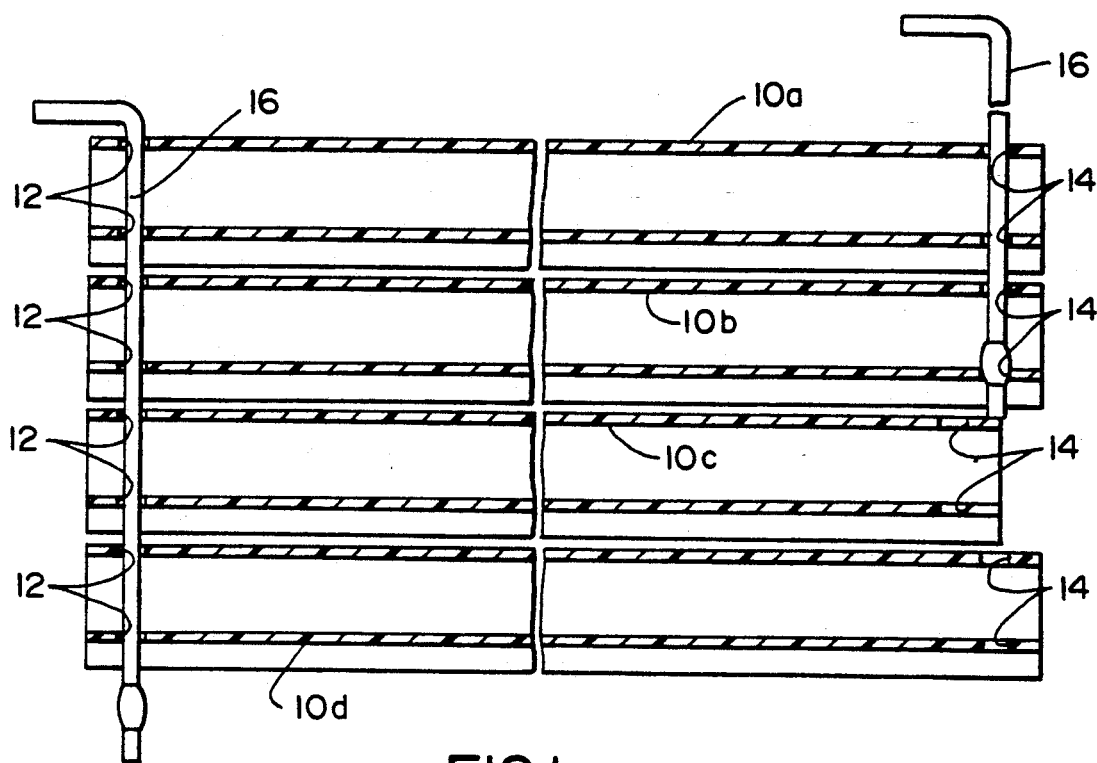
FIG.I (PRIOR ART)
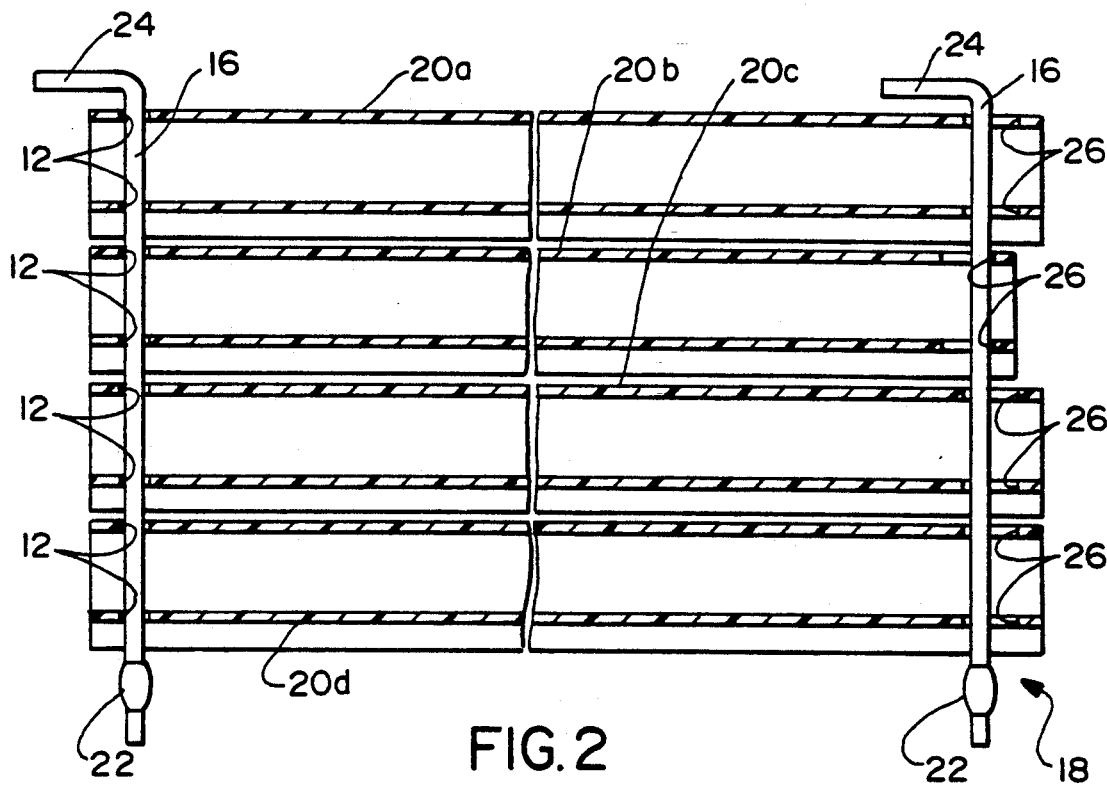
FIG.2

PACKAGING SYSTEM INCORPORATING STORAGE TUBES FOR ELECTRICAL CONNECTORS

FIELD OF THE INVENTION

This invention generally relates to the art of electrical connectors and, particularly, to a packaging system for storing and handling electrical connectors, or the like, by employing connector-containing storage tubes.

BACKGROUND OF THE INVENTION

During the manufacture of electrical connectors, integrated circuits and other electrical or electronic devices, the devices are stored in and transferred to and from various types of equipment for carrying out different manufacturing or assembling steps. For instance, the devices may be assembled, tested, inspected, and the like, during which the devices are stored, protected and handled in protective storage tubes between various manufacturing processes or machines. Most such tubes are fabricated of extruded plastic material, but the tubes may be made of metal or other appropriate material. A "rack" of the tubes may be loaded into a "magazine" of an assembly machine, with the devices being dispensed seriatim from each individual tube, whereafter the tube is discarded for dispensing devices from the successive tube in the rack.

As an example, only, such storage tubes may hold as many as twenty-five or more electrical devices for handling during manufacture. When processing is complete, the devices also may be shipped to customers in the tubes. A very large electronic manufacturer may process thousands and thousands of electronic devices in any given lot. For every one-thousand electronic devices, forty storage tubes are used. A plurality of the tubes normally are stored in a bulk container or tote box which is transferred, along with the related paperwork, between separate manufacturing processes or to the customer.

Heretofore, one packaging system has utilized a pair of elongated stop rods for holding the electronic devices in their respective tubes, and to hold a plurality of the tubes for conjoint manual manipulation. More particularly, each tube is provided with an aperture therethrough near each opposite end thereof. When a "rack" of tubes are assembled with a plurality of tubes in a generally parallel juxtaposition, the stop rods are inserted through the aligned apertures of all of the tubes in the rack to close-off the ends of the tubes and to allow for manual handling of an entire rack of tubes interconnected by the rods.

Heretofore, after the electronic devices have been completely processed or finally used by a customer, the storage tubes have been discarded. In other words, the tubes have been considered as disposable items. However, with ever-increasing manufacturing volume, and with ever-increasing environmental considerations, it has become expedient to reuse or recycle such storage tubes. These recycling programs have encountered problems when the packaging system uses stop rods or pins at the ends of a plurality of tubes, as described above.

More particularly, the storage tubes are manufactured (i.e. extruded) in lots. The spacing between the apertures at the ends of the tubes (i.e. through which the stop rods extend) often vary from one manufacturing lot to another manufacturing lot. The tubes are not returned for recycling in any sorted lot system. In addition, some tubes may be subjected to differing extreme temperatures during certain manufacturing processes or storage conditions, causing the tubes to elongate or shrink in length. The end result is that any given "rack" of tubes are randomly gathered and the apertures at the ends of the tubes for receiving the elongated stop rods are not in alignment, thereby preventing at least one of the stop rods from passing through all of the tubes to hold the tubes in the rack or stacked array. This invention is directed to solving this problem and thereby enhancing or promoting programs for the recycling of storage tubes for electronic devices, as described above.

SUMMARY OF THE INVENTION

An object, therefore, of the invention is to provide a new and improved packaging system for storing and handling electrical connectors, or the like, particularly a system employing a plurality of elongated connector-containing tubes.

As disclosed herein, each tube has an aperture therethrough near each opposite end thereof. The apertures are spaced longitudinally of the respective tubes so that a pair of assembly stop rods can be passed through the aligned apertures of a plurality of generally parallel juxtaposed tubes. The rods hold the tubes in a generally stacked array or "rack" of tubes for use throughout a variety of manufacturing processes or machines, as well as for shipping loaded tubes to a customer.

In order to enhance recycling of the connector-containing tubes, the invention contemplates that at least one aperture in each tube be enlarged relative to the cross-dimensions of the assembly rods for accommodating any variances in the spacing between the apertures of any given tubes. In the exemplary embodiment of the invention, the enlarged apertures are formed as elongated slots extending longitudinally of the tubes.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

FIG. 1 is a vertical section through a rack of recycled tubes and a pair of assembly rods, as might be encountered with the prior art;

FIG. 2 is a view similar to that of FIG. 1, but employing the concepts of the invention;

DETAILED DESCRIPTION OF THE PREFERRED EMBODIMENT

Figure 3:
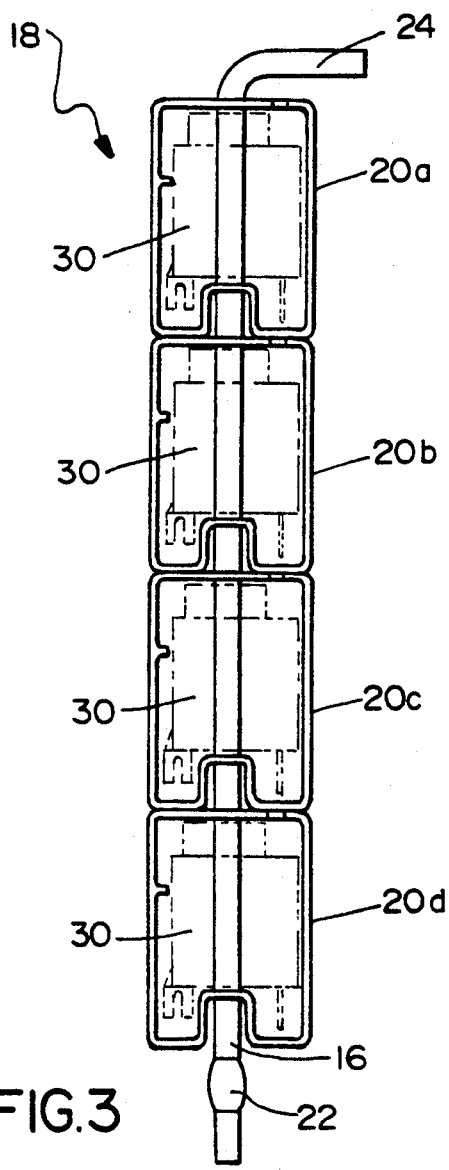
FIG. 3 is a side elevational view of a rack of tubes showing the tubes loaded with electrical connectors.

Referring to the drawings in greater detail, and first to FIG. 1, a packaging system is shown according to the prior art, for storing and handling electrical connectors by the use of a plurality of elongated connector-containing tubes 10a-10d. Each tube has apertures therethrough near each opposite end thereof. As shown in FIG. 1, apertures 12 are provided at one end of each tube and apertures 14 are provided at the opposite end of each tube. When the tubes are originally manufactured, such as being extruded of plastic material, the spacing between apertures 12 and 14 of the respective tubes can be maintained fairly constant. Therefore, a "rack" of the tubes can be created by using a pair of assembly rods 16 passed through the aligned apertures 12 at one ends of the tubes and the aligned apertures 14 at the opposite ends of the tubes to hold the tubes in a generally parallel juxtaposition as shown in FIG. 1.

Assembling a rack of tubes from an original manufacturing lot thereof, by using assembly rods 16, is easy to effect because of the constant spacing between apertures 12 and 14 in the original manufactured lot of tubes. However, as explained in the "Background", above, if a recycling program is desired for reusing the tubes, the tubes will be returned for loading in a random batch which will include tubes from different manufacturing lots. Due to manufacturing tolerances, the spacing between apertures 12 and 14 of tubes from one lot may vary from the spacing of the apertures of any other given lot. In addition, the returned or recycled tubes may have encountered differing extreme temperatures during their prior use, and the tubes may have become elongated or shrunk in length, thereby again varying the spacing between the apertures of the tubes.

This condition described immediately above is shown in the prior art of FIG. 1 wherein it can be seen that the left-hand assembly rod 16 has been inserted through aligned apertures 12 in all of tubes 10a-10d. However, it can be seen that the right-hand assembly rod 16 has passed through aligned apertures 14 in tubes 10a and 10b, but apertures 14 in tube 10c are not in the same alignment. In other words, tube 10c has shrunk relative to tubes 10a and 10b. The converse could be true as represented by tube 10d which is shown as having been elongated relative to tubes 10a and 10b. Consequently, the right-hand assembly rod 16 cannot be inserted through apertures 14 of all of the tubes. This prevents the tubes from being reused and obviates any attempts to install a desirable recycling program or packaging system.

FIG. 2 shows a packaging system, generally designated 18, embodying the concepts of the invention. Again, a plurality of elongated connector-containing tubes 20a-20d are shown in a stacked array of generally parallel juxtaposed tubes, to define a "rack" of tubes held in juxtaposition by a pair of the assembly rods 16. Each tube 20a-20d has apertures 12 at one end thereof for receiving one of the assembly rods 16. These apertures may be just slightly larger than the cross-dimensions of the assembly rod. If the tubes are fabricated of thin plastic material, one end of each assembly rod may be provided with a small head 22 which can pass through all of apertures 12 by a snap-action but prevent the rod from backing out of the apertures accidentally. An angled manually-graspable handle 24 is provided at the opposite end of each rod 16.

The right-hand areas of FIG. 2 show that tubes 20a-20d are not of equal length, similar to the situation shown by the prior art in FIG. 1. In other words, tubes 20a-20d depict a common situation which might be encountered when assembling reused tubes, i.e. in a recycling program. However, it can be seen that the right-hand assembly rod 16 in FIG. 2 has been freely inserted through the stacked array of tubes. This is afforded by the concepts of the invention.

More particularly, the invention contemplates the provision of apertures 26 in at least one end of each tube, the apertures being enlarged relative to the cross-dimensions of assembly rods 16. By enlarging apertures 26, accommodations are made for any variances in the spacing between apertures 12 and 26 of any given tubes.

Figure 4:
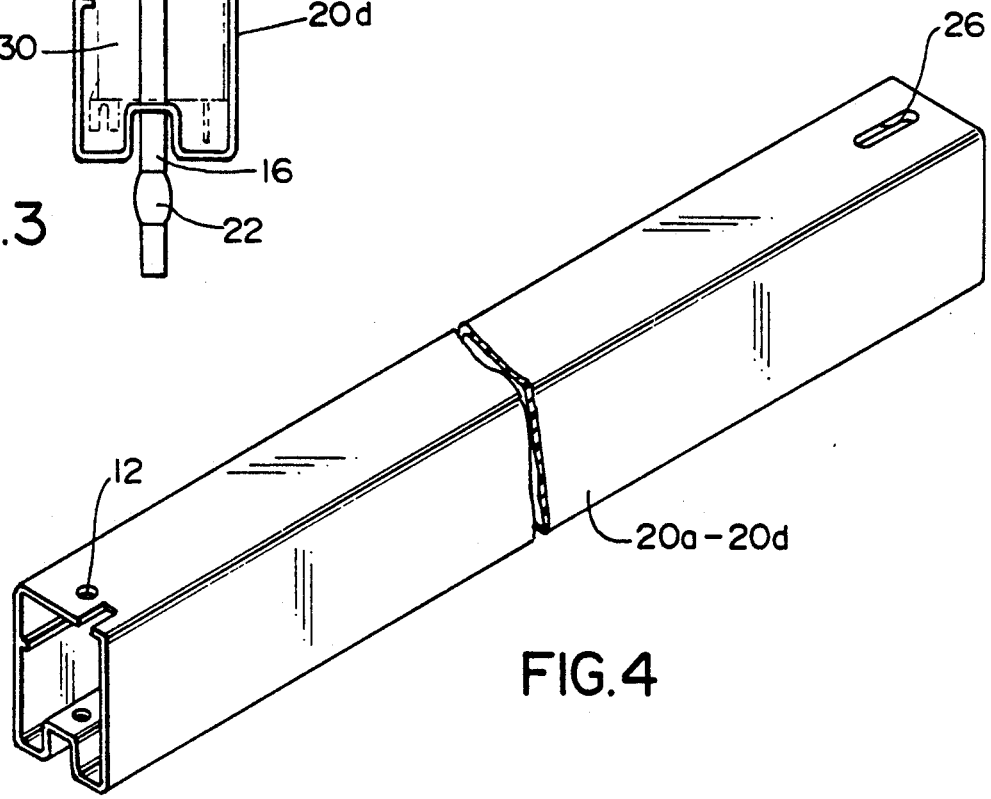
FIG. 4 is a perspective view of a single tube according to the invention.

Referring to FIG. 4 in conjunction with FIG. 2, it can be seen that apertures 26 actually are formed by elongated slots which extend longitudinally of the tubes. In other words, the transverse dimensions of slots 26 are similar to the sizes of apertures 12 at the opposite ends of the tubes, but the slots are elongated in the longitudinal direction of the tubes to accommodate variances in the spacing of the apertures caused by different manufacturing tolerances of the tube lengths as well as elongation or shrinking of the tubes during use.

FIG. 3 simply shows a "rack" of tubes 20a-20d to illustrate that electrical connectors 30 are loaded into the tubes between their ends. Assembly rods 16 perform a dual function of acting as stop rods to hold the connectors in the tubes between the rods at the opposite ends of the tubes.

It should be understood that the use of the term "connectors" herein and in the claims hereof is not to be construed as limiting in any way. The term "connectors" is used to include all kinds of electrical or electronic devices, such as integrated circuits or the like, which commonly are stored, handled and transferred in elongated tubes such as tubes 10a-10d and 20a-20d as described herein. In addition, although the drawings show only four tubes 10a-10d or 20a-20d in the illustrated "rack" of tubes, in actual practice, the tubes are much longer than that depicted in the drawings and many more than four tubes normally are assembled in a generally parallel juxtaposition or rack of tubes.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

We claim:

1. In a packaging system for storing and handling electrical connectors, including a plurality of elongated connector-containing tubes, each tube having an aperture therethrough near each opposite end thereof, the apertures being spaced longitudinally of the respective tubes so that a pair of assembly rods can be passed through aligned apertures of a plurality of generally parallel juxtaposed tubes to hold the tubes in a generally stacked array, wherein the improvement comprises at least one aperture in each tube being enlarged relative to the rod passing therethrough for accommodating any variances in the spacing between the apertures in any particular tubes.

2. In a packaging system as set forth in claim 1, wherein said at least one aperture in each tube comprises an elongated slot extending longitudinally of the tube.

* * * * *